(12) United States Patent
Hsieh et al.

(10) Patent No.: US 6,878,917 B2
(45) Date of Patent: Apr. 12, 2005

(54) INJECTION MOLDED IMAGE SENSOR AND A METHOD FOR MANUFACTURING THE SAME

(75) Inventors: Jackson Hsieh, Hsinchu Hsien (TW); Jichen Wu, Hsinchu Hsien (TW); Bruce Chen, Hsinchu Hsien (TW); Worrell Tsai, Hsinchu Hsien (TW)

(73) Assignee: Kingpak Technology, Inc., Hsinchu Hsien (TW)

( * ) Notice: Subject to any disclaimer, the term of this patent is extended or adjusted under 35 U.S.C. 154(b) by 268 days.

(21) Appl. No.: 10/321,926

(22) Filed: Dec. 16, 2002

(65) Prior Publication Data

US 2004/0113049 A1 Jun. 17, 2004

(51) Int. Cl.⁷ ............................................. H01L 27/00
(52) U.S. Cl. ..................................... 250/208.1; 250/239
(58) Field of Search ............................. 250/208.1, 239, 250/214.1; 257/291, 433, 81, 82, 84; 438/15, 25, 27

(56) References Cited

U.S. PATENT DOCUMENTS 5,424,531 A * 6/1995 O'Regan et al. ............ 250/216

* cited by examiner

Primary Examiner—Que T. Le
(74) Attorney, Agent, or Firm—Pro-Techtor International Services

(57) ABSTRACT

An injection molded image sensor includes metal sheets arranged in a matrix, an injection molded structure, a photosensitive chip, bonding pads, wires, and a transparent layer. Each metal sheet has a first board, a second board and a third board to form a ⊏-shaped structure. The molded structure encapsulates the metal sheets by way of injection molding and has a first molded body and a second molded body. The injection molded structure has a U-shaped structure and is formed with a cavity. The first boards are partially encapsulated by the first molded body. The second and third boards are exposed from bottom and side surfaces of the first molded body. The chip is mounted within the cavity. The pads are formed on the chip. The wires electrically connect the pads to input terminals of the first boards. The transparent layer covers over the first molded body to encapsulate the chip.

7 Claims, 2 Drawing Sheets

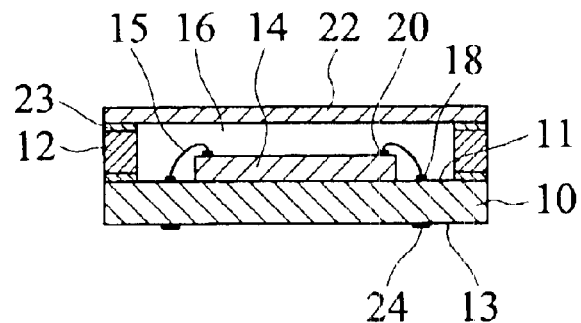
FIG.1 (PRIOR)
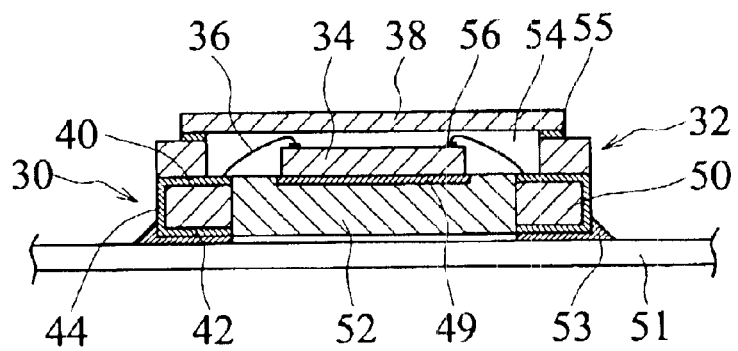
FIG. 2
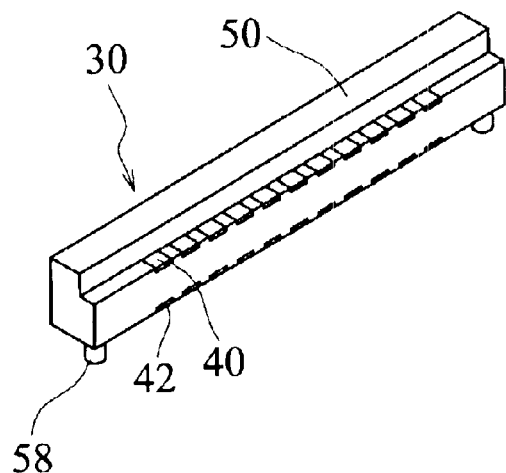
FIG. 3

INJECTION MOLDED IMAGE SENSOR AND A METHOD FOR MANUFACTURING THE SAME

BACKGROUND OF THE INVENTION

1. Field of the Invention

The invention relates to an image sensor and a method for manufacturing the same, and more particularly to an image sensor formed by way of injection molding.

2. Description of the Related Art

A general sensor is used for sensing signals, which may be optical or audio signals. The sensor of the invention is used for receiving image signals or optical signals. After receiving image signals, the image sensor converts the image signals into electrical signals, which are then transmitted to a printed circuit board via a substrate.

Referring to FIG. 1, a conventional method for packaging an image sensor includes the steps of:

providing a substrate 10 having an upper surface 11 formed with signal input terminals 18 and a lower surface 13 formed with signal output terminals 24;

providing a frame layer 12 on the substrate 10 to form a cavity 11 together with the substrate 10;

providing a photosensitive chip 14 on the substrate 10 and within the cavity 11, a plurality of bonding pads 20 being formed on the photosensitive chip 14;

providing a plurality of wires 16 for electrically connecting the bonding pads 20 of the photosensitive chip 14 to the signal input terminals 18 of the substrate 10, respectively; and providing a transparent layer 22, which is coated with an adhesive layer 23, on the frame layer 12 for covering and encapsulating the photosensitive chip 14.

The image sensor manufactured according to the above-mentioned method has the following drawbacks.

1. The image sensor has to be individually manufactured and cannot be manufactured in mass production, so the cost thereof cannot be decreased.

2. During the packaging processes, a substrate 10 has to be provided for each package body, and then a frame layer 12 has to be adhered to the substrate 10. Therefore, the manufacturing processes are inconvenient and the material cost may be increased. In addition, the overflowed adhesive may influence the wire bonding process.

SUMMARY OF THE INVENTION

An object of the invention is to provide an injection molded image sensor and a method for manufacturing the same, in which the mass production may be achieved by way of injection molding and the manufacturing cost may be effectively decreased.

Another object of the invention is to provide an injection molded image sensor and a method for manufacturing the same, in which a frame layer of the image sensor is formed by way of injection molding so that the overflowed adhesive or glue cannot influence the wire bonding process.

Still another object of the invention is to provide an injection molded image sensor and a method for manufacturing the same, in which metal sheets serve as a substrate and traces thereon so that the manufacturing cost may be effectively decreased.

To achieve the above-mentioned objects, the invention provides an injection molded image sensor for being electrically connected to a printed circuit board. The image sensor includes a plurality of metal sheets arranged in a matrix, an injection molded structure, a photosensitive chip, a plurality of bonding pads, a plurality of wires, and a transparent layer. Each metal sheet has a first board, a second board and a third board to form a ⊏-shaped structure. The injection molded structure encapsulates the metal sheets by way of injection molding and has a first molded body and a second molded body. The injection molded structure has a U-shaped structure and is formed with a cavity. A portion of each of the first boards of the metal sheets is inside the first molded body while another portion of each of the first boards is exposed from the first molded body to form signal input terminals, the second boards are exposed from a bottom surface of the first molded body to form signal output terminals, which are to be electrically connected to the printed circuit board, and the third boards are exposed from a side surface of the first molded body. The photosensitive chip is mounted within the cavity of the injection molded structure. The bonding pads are formed on the photosensitive chip. The wires electrically connect the bonding pads to the signal input terminals. The transparent layer covers over the first molded body to encapsulate the photosensitive chip.

To achieve the above-mentioned objects, the invention also provides a method for manufacturing an injection molded image sensor. The method includes the steps of:

providing a plurality of metal sheets arranged in a matrix, each of the metal sheets having a first board, a second board and a third board to form a ⊏-shaped structure;

performing a first injection molding process to seal the metal sheets and form a first molded body, wherein a portion of each of the first boards is encapsulated by the first molded body while another portion of each of the first boards is exposed from the first molded body to form signal input terminals, the second boards are exposed from a bottom surface of the first molded body to form signal output terminals, and the third boards are exposed from a side surface of the first molded body;

providing a connection board;

placing four first molded bodies around the connection board to form a U-shaped structure;

performing a second injection molding process to mold the first molded bodies and the connection board into a second molded body so that the second molded body is combined with the first molded bodies and is formed with a cavity;

placing a photosensitive chip, on which a plurality of bonding pads is formed, within the cavity;

providing a plurality of wires for electrically connecting the bonding pads to the signal input terminals; and placing a transparent layer over the first molded bodies to encapsulate the photosensitive chip.

BRIEF DESCRIPTION OF THE DRAWINGS

FIG. 1 is schematic illustration showing a conventional image sensor.

FIG. 2 is a cross-sectional view showing an injection molded image sensor of the invention.

FIG. 3 is a first schematic illustration showing the method for manufacturing the injection molded image sensor of the invention.

DETAILED DESCRIPTION OF THE INVENTION

Figure 4:
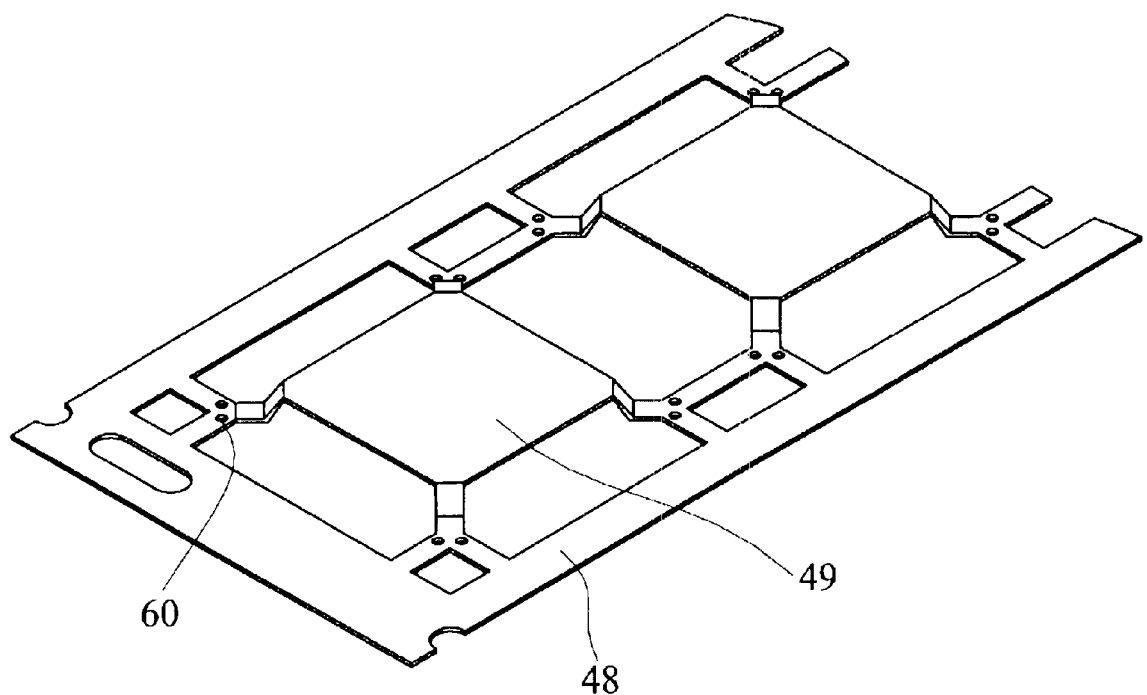
FIG. 4 is a second schematic illustration showing the method for manufacturing the injection molded image sensor of the invention.

Referring to FIG. 2, an injection molded image sensor of the invention includes a plurality of metal sheets 30 arranged in a matrix, an injection molded structure 32, a photosensitive chip 34, a plurality of wires 36 and a transparent layer 38.

Each metal sheet 30 has a first board 40, a second board 42 and a third board 44 connecting the first board 40 to the second board 42.

The injection molded structure 32 is formed to encapsulate or seal the metal sheets 30 by way of injection molding so as to form a first molded body 50 and a second molded body 52. The injection molded structure 32 is of a U-shaped structure and has a cavity 54. A portion of each of the first boards 40 is encapsulated by the first molded body 50, while another portion of each of the first boards 40 is exposed from the first molded body 50 to form signal input terminals. The second boards 42 are exposed from the bottom surface of the first molded body 50 to form signal output terminals, which are electrically connected to a printed circuit board 51 by the solder tin 53 using the surface mount technique (SMT). The third boards 44 are exposed from the side surface of the first molded body 50 so that the solder tin 53 may climb to the third board 44 during the SMT process for stably mounting and bonding the metal sheets 30 to the printed circuit board 51. In addition, a middle board 49 is arranged on the second molded body 52.

The photosensitive chip 34, which is arranged within the cavity 54 of the injection molded structure 32 and adhered to the middle board 49, has a plurality of bonding pads 56 thereon.

The wires 36 electrically connect the bonding pads 56 of the photosensitive chip 34 to the signal input terminals formed at the first boards 40 of the metal sheet 30, respectively.

The transparent layer 38 is mounted to the first molded body 50 to encapsulate or seal the photosensitive chip 34.

Referring to FIGS. 3 and 2, a method for manufacturing the injection molded image sensor includes the following steps. First, a plurality of metal sheets 30 is provided. Each metal sheet 30 includes a first board 40, a second board 42 and a third board 44, all of which form a "⊏ shape" structure.

Next, a first injection molding process is performed to encapsulate or seal each metal sheet 30 so as to form a first molded body 50. First engagement portions 58, which may be projections, are formed at edges of the first molded body 50. At this time, a portion of each of the first boards 40 of the metal sheets 30 is encapsulated by the first molded body 50 while another portion of each of the first boards 40 is exposed from the first molded body 50 to form signal input terminals, the second boards 42 are exposed from the bottom surface of the first molded body 50 to form signal output terminals, and the third boards 44 electrically connecting the first board 40 to the second board 42 are exposed from the side surface of the first molded body 50.

Then, as shown in FIGS. 2 and 4, a connection board 48 is provided. Second engagement portions 60, which may be slots, are formed at positions corresponding to the first engagement portions 58 of the first molded body 50 so as to engage with the first molded body 50. In addition, the connection board 48 is also formed with a middle board 49.

Figure 5:
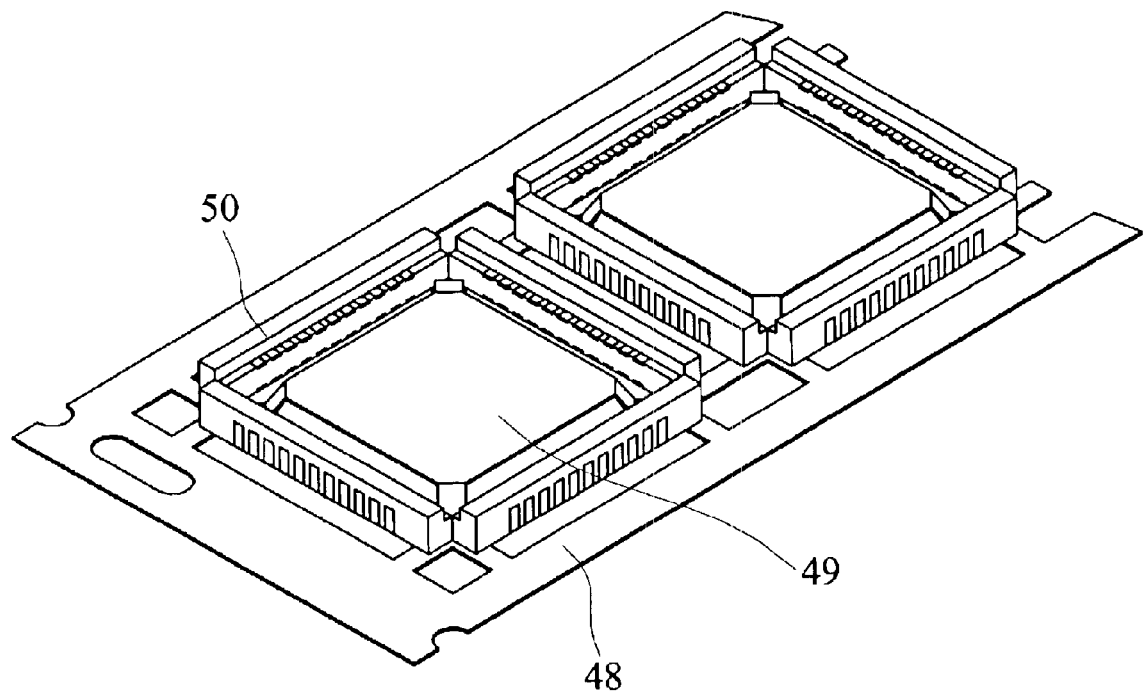
FIG. 5 is a third schematic illustration showing the method for manufacturing the injection molded image sensor of the invention.

As shown in FIG. 5, four first molded bodies 50 are arranged at the periphery of the connection board 48 to form U-shaped sections.

Please refer again to FIG. 2. A second injection molding process is performed to mold the connection board 48 and the first molded bodies 50 into a second molded body 52, which is formed with a cavity 54 and combined with the first molded bodies 50. The middle board 49 of the connection board 48 is exposed from the second molded body 52 and is positioned above the second molded body 52.

Then, a photosensitive chip 34, on which a plurality of bonding pads 56 are formed, is placed within the cavity 54 and mounted to the middle board 49.

Next, a plurality of wires 36 for electrically connecting the bonding pads 56 of the photosensitive chip 34 to the signal input terminals of the first boards 40 of the metal sheets 30 is provided to transmit signals from the photosensitive chip 34 to the metal sheet 30.

Then, a transparent layer 38 is adhered to the four first molded bodies 50 by an adhesive layer 55 so that the photosensitive chip 34 may be encapsulated or sealed.

According to the above-mentioned method, when the image sensor is surface-mounted to the printed circuit board 51, the solder tin 53 may climb to the third boards 44 along the second boards 42 of the metal sheets 30 such that the image sensor may be firmly combined with and bonded to the printed circuit board 51.

According to the above-mentioned structure, the injection molded image sensor and method of the invention has the following advantages.

1. A third board 44 is provided in each metal sheet 30 to connect the first board 40 to the second board 42 and is formed on the side surface of the first molded body 50. So, during the process for surface-mounting the image sensor to the printed circuit board 51, the solder tin 53 may climb to the third board 44 such that the image sensor may be firmly combined with and bonded to the printed circuit board.

2. Since the image sensors may be manufactured by way of injection molding, the manufacturing costs thereof may be effectively decreased using a mass production method.

3. Since the frame layer is formed by way of injection molding, it is possible to prevent the glue or adhesive from overflowing.

4. Since the metal sheets 30 may serve as the conventional substrate and traces thereon, the material and manufacturing costs may be effectively decreased.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An injection molded image sensor for being electrically connected to a printed circuit board, the image sensor comprising:

a plurality of metal sheets arranged in a matrix, each of the metal sheets having a first board, a second board and a third board to form a ⊏-shaped structure;

an injection molded structure for encapsulating the metal sheets by way of injection molding, the injection molded structure having a first molded body and a second molded body, the injection molded structure having a U-shaped structure and being formed with a cavity, wherein a portion of each of the first boards of the metal sheets is inside the first molded body while another portion of each of the first boards is exposed from the first molded body to form signal input terminals, the second boards are exposed from a bottom surface of the first molded body to form signal output terminals, which are to be electrically connected to the printed circuit board, and the third boards are exposed from a side surface of the first molded body;

a photosensitive chip mounted within the cavity of the injection molded structure;

a plurality of bonding pads formed on the photosensitive chip;

a plurality of wires for electrically connecting the bonding pads to the signal input terminals; and a transparent layer covering over the first molded body to encapsulate the photosensitive chip.

2. The image sensor according to claim 1, further comprising a middle board arranged on the second molded body, wherein the photosensitive chip is placed on the middle board.

3. The image sensor according to claim 1, wherein the second boards of the metal sheets are electrically connected to the printed circuit board by way of a surface mount technique so that solder tin may climb to the third boards of the metal sheets.

4. A method for manufacturing an injection molded image sensor, comprising the steps of:

providing a plurality of metal sheets arranged in a matrix, each of the metal sheets having a first board, a second board and a third board to form a ⊏-shaped structure;

performing a first injection molding process to seal the metal sheets and form a first molded body, wherein a portion of each of the first boards is encapsulated by the first molded body while another portion of each of the first boards is exposed from the first molded body to form signal input terminals, the second boards are exposed from a bottom surface of the first molded body to form signal output terminals, and the third boards are exposed from a side surface of the first molded body;

providing a connection board;

placing four first molded bodies around the connection board to form a U-shaped structure;

performing a second injection molding process to mold the first molded bodies and the connection board into a second molded body so that the second molded body is combined with the first molded bodies and is formed with a cavity;

placing a photosensitive chip, on which a plurality of bonding pads is formed, within the cavity;

providing a plurality of wires for electrically connecting the bonding pads to the signal input terminals; and placing a transparent layer over the first molded bodies to encapsulate the photosensitive chip.

5. The method according to claim 4, further comprising:

placing a middle board on the connection board and mounting the photosensitive chip to the middle board.

6. The method according to claim 4, further comprising:

forming a first engagement portion on the first molded body; and forming a second engagement portion on the connection board so as to engage with the first engagement portion.

7. The method according to claim 6, wherein the first engagement portion is a projection, and the second engagement portion is a slot.

* * * * *